United States Patent [19]

King et al.

[11] Patent Number: 5,835,522
[45] Date of Patent: Nov. 10, 1998

[54] ROBUST PASSIVELY-LOCKED OPTICAL CAVITY SYSTEM

[75] Inventors: David A. King, Palo Alto; Richard J. Pittaro, San Carlos, both of Calif.; Alexander Huber, Lautenbach, Germany

[73] Assignee: Hewlett-Packard Co., Palo Alto, Calif.

[21] Appl. No.: 752,704

[22] Filed: Nov. 19, 1996

[51] Int. Cl.$^6$ .................................................. H01S 3/082
[52] U.S. Cl. ........................... 372/97; 372/103; 372/106; 372/99; 372/108; 372/93; 372/95; 372/18; 372/31; 372/21
[58] Field of Search ................................ 372/92, 95, 103, 372/106, 99, 97, 93, 108, 22, 21, 31; 371/32, 18

[56] References Cited

U.S. PATENT DOCUMENTS

| | | | |
|---|---|---|---|
| 4,498,184 | 2/1985 | O'Meara | 372/92 |
| 4,648,714 | 3/1987 | Benner et al. | 356/301 |
| 4,884,276 | 11/1989 | Dixon et al. | 372/21 |
| 4,907,237 | 3/1990 | Dahmani et al. | 372/32 |
| 4,942,588 | 7/1990 | Yasui et al. | 372/103 |
| 5,022,034 | 6/1991 | May et al. | 372/106 |
| 5,038,352 | 8/1991 | Lenth et al. | 372/21 |
| 5,079,772 | 1/1992 | Negus et al. | 372/103 |
| 5,392,310 | 2/1995 | Klein | 372/103 |
| 5,404,366 | 4/1995 | Wakabayashi et al. | 372/108 |
| 5,432,610 | 7/1995 | King et al. | 356/432 |
| 5,437,840 | 8/1995 | King et al. | 422/82.08 |
| 5,477,554 | 12/1995 | Yoshii et al. | 372/9 |
| 5,555,253 | 9/1996 | Dixon | 372/29 |
| 5,572,542 | 11/1996 | Dixon | 372/92 |
| 5,642,375 | 6/1997 | King et al. | 372/92 |
| 5,644,589 | 7/1997 | Anthon | 372/97 |

OTHER PUBLICATIONS

Dube, P. et al., "Thermally Induced Self–Locking of an Optical Cavity by Overtone Absorption in Acetylene Gas", Sep. 1996, vol. 13, No. 6, pp. 2041–2054, *Journal of the Optical Society of America.*

Wigley, P.G. et al., "High–Power 467 nm Passively–Locked Signal–Resonant . . . ", 1995, *Center for Research in Electro–Optics and Lasers (CREOL).* University of Central Florida, Orlando, FL.

Kozlovsky, W. J. et al., "Blue Light Generation by Resonator–Enhanced Frequency . . . , " Aug. 1, 1994, 65 (5), pp. 173–175, 525–527, *Applied Physics Letters.*

Schmidt, E. et al., "Evaporation Coatings", May 1995, pp. 126–128, *Photonics Spectra.*

Zorabedian, P., "Axial–Mode Instability in Tunable External–Cavity . . . ", Jul. 1994, vol. 30, No. 7, pp. 1542–1552, *IEEE Journal of Quantum Electronics.*

Arimoto, Satoshi et al., "150 mW Fundamental–Transverse–Mode . . . , " Jun. 1993, vol. 29, No. 6, pp. 1874–1879, *IEEE Journal of Quantum Electronics.*

Ueno, Yoshiyasu et al., "30–mW 690–nm High–Power Strained–Quantum–Well . . . ", Jun. 1993, vol. 29, No. 6, pp. 1851–1856, *IEEE Journal of Quantum Electronics.*

(List continued on next page.)

*Primary Examiner*—Leon Scott, Jr.
*Attorney, Agent, or Firm*—Philip S. Yip

[57] ABSTRACT

A laser system capable of providing light of high intensity is disclosed. This system includes a laser gain medium and three reflectors. A first reflector and a second reflector spaced from the first reflector define a laser cavity that contains the laser gain medium. Light reflected by the first reflector is amplified by the laser gain medium. A third reflector is spaced from the second reflector to define a resonant cavity external to the laser cavity. Light passes from the laser cavity to resonate in the external resonant cavity. Part of the light passes from the external resonant cavity to the laser cavity. A light-screening device, e.g., an aperture, is disposed between the second reflector and the gain medium to screen light reflected from the external cavity such that the light portion of constructive interference is preferentially passed over the light portion of destructive interference. This enables the gain medium to optically lock to the resonant frequency of the external cavity.

19 Claims, 12 Drawing Sheets

OTHER PUBLICATIONS

Parke, R. et al., "2.0 W CW, Diffraction–Limited Operation . . . ", Mar. 1993, vol. 5, No. 3, pp. 297–300, *IEEE Photonics Technology Letters*.

Simonsen, H., "Frequency Noise Reduction of Visible InGa/AIP Laser . . . ", Mar. 1993, vol. 29, No. 3, pp. 877–884, *IEEE Journal of Quantum Electronics*.

Yan, G.–Y. et al., "Measurement of Diode Laser Characteristic . . . ", Nov. 1992, vol. 9, No. 11, pp. 2122–2127, *Optical Society of America*.

Lyu, Gap–Youl et al., "A Novel Method of Measuring Linewidth . . . ", May 1, 1993, vol. 98, No. 4,5,6, pp. 281–284, *Optics Communications*.

Baev, V. M. et al., "Intra–Cavity Spectroscopy with Diode Lasers", 1992, B55, pp. 463–477, *Applied Physics*.

Iiyama, Koichi et al., "Simple Method for Measuring the Linewidth . . . ", Aug. 15, 1992, vol. 17, No. 16, pp. 1128–1130 *Optics Letters*.

Kean, P. N. et al., "Efficient Sum–Frequency Upconversion . . . ", Jan. 15, 1992, vol. 17, No. 2, pp. 127–129, *Optics Letters*.

Jerman, J. H. et al., "A Miniature Fabry–Perot Interferometer . . . ," 1991, 29 pp. 151–158, *Sensors and Actuators A*.

Polzik, E. S. et al., "Frequency Doubling with KNbO3 in an External Cavity", Sep. 14, 1991, vol. 16, No. 18, pp. 1400–1402, *Optics Letters*.

Buch, Peter et al., "Optically Self–Locked Semiconductor . . . ", Jul. 1991, vol. 27, No. 7, pp. 1863–1868 *IEEE Journal of Quantum Electronics*.

Wieman, C. et al., "Using Diode Lasers for Atomic Physics", Jan. 1991, vol. 62, No. 1, pp. 1–20, *Rev. Sci. Instrum.*

Buus, Jens, "Single Frequency Semiconductor Lasers", vol. TT5, pp. 84–87 *SPIE Optical Engineering Press*.

Hemmerich, A. et al., "Second–Harmonic Generation and Optical Stabilization . . . ", Apr. 1, 1990, vol. 15, No. 7, pp. 372–374, *Optics Letters*.

Rong–Qing, H. et al., "Improved Rate Equations for External Cavity . . . ", Jun. 1989,, vol. 25, No. 6, pp. 1580–1584, *IEEE Journal of Quantum Electronics*.

Dixon, G. J. et al., "432–nm Source Based on Efficient Second Hamonic Generation . . . ", Jul. 5, 1989, vo. 14, No. 14, pp. 731–733 *Optics Letters*.

Kozlovsky, W. J. et al., "Resonator–Enhanced Frequency Doubling . . . " Jan. 5, 1989, vol. 25, No. 1, pp. 27–28 *Electronics Letters*.

Tanner, C. et al., "Atomic Beam Collimation . . . ", May 1988, vol. 13, No. 5, pp. 357–359, *Optics Letters*.

Dahmani, B. et al., "Frequency Stabilization of Semiconductor Laser . . . ", Nov. 1987, vol. 12, No. 11, pp. 876–878 *Optics Letters*.

Tkach, R. W. et al., "Regimes of Feedback Effects in 1.5–$\mu$m . . . ", Nov. 1986, vol. LT–4, No. 11, pp. 1655–1661, *Journal of Lightwave Technology*.

Siegman, A., "Laser", 1986, p. 511, *The Laser Threshold Region*, University Science Books, Mill Valley, CA.

Temkin, H. et al., "Reflection Noise in Index–Guided InGaAsP Lasers", Feb. 1986, vol. QE–22, No. 2, pp. 286–293, *IEEE Journal of Quantum Electronics*.

Henry, C. H., et al., "Locking Range and Stability of Injection . . . ", Aug. 1985, vol. QE–21, No. 8, pp. 1152–1156, *IEEE Journal of Quantum Electronics*.

Eisentein, G. et al., "High Quality Antireflection Coatings . . . ", Jan. 1984, vol. 23, No. 1, pp. 161–164 *Applied Optics*.

Wyatt, R. et al., "10 kHz Linewidth 1.5 $\mu$m InGaAsP . . . ", Feb. 3, 1983, vol. 19, No. 3, pp. 110–112, *Electronics Letters*.

Demtröder, Wolfgang, "Laser Spectroscopy", 1982, pp. 390–395.

Fleming, Mark W. et al., "Spectral Characteristics of External–Cavity . . . ", Jan. 1981, vol. QE–17, No. 1, pp. 44–59 *IEEE Journal of Quantum Electronics*.

ROBUST PASSIVELY-LOCKED OPTICAL CAVITY SYSTEM

FIELD OF THE INVENTION

This invention relates to optical systems for the generation of laser radiation. More particularly, this invention relates to a diode-pumped, passively-locked laser with a linear optical cavity.

In many laser applications (for example, chemical sensing), high-intensity laser light is needed. One way to provide high-intensity light is using light trapped inside an optical cavity. An optical cavity or resonator consists of two or more mirrored surfaces arranged so that incident light may be trapped, bouncing back and forth between the mirrors. In this way, the light inside the cavity may be many orders of magnitude more intense than the incident light.

In many applications, the optical gain medium (such as a helium neon discharge tube) is within the optical cavity. For a typical diode laser, the cavity mirrors are deposited directly on the diode gain medium itself. For some applications, however, such as frequency-tuning and linewidth-narrowing, one or both of the diode's facets is anti-reflection-coated and the diode is operated inside an optical cavity defined by mirrors external to the diode. Although a diode gain medium may be operated inside such a cavity, the low damage threshold of the diode's emission facet severely limits the amount of power build-up in the cavity.

To overcome this limitation while still generating a large optical field, the diode laser may be placed outside of a separate high-finesse optical cavity in which the diode laser radiation is trapped. This separate cavity is referred to hereinafter as a "build-up" cavity. Diode lasers, however, emit radiation with an optical bandwidth that is much larger than that of a high-finesse build-up cavity. To achieve substantial amplification of diode laser radiation in a build-up cavity the diode laser must be forced to emit coherent radiation with a bandwidth that approaches or matches that of the cavity at a cavity resonant frequency. This process is hereinafter called "optical locking" or "optical frequency locking."

One way to reduce the bandwidth of diode lasers is to use all-electronic frequency-locking of diode lasers. This technique, however, requires very fast servos, a large degree of optical isolation of the diode laser from the cavity, and sophisticated electronic control.

As an alternative, substantial linewidth reduction can be achieved with optical feedback (i.e., passive) schemes. For example, Dahmani et al., in "Frequency stabilization of semi-conductor lasers by resonant optical feedback," Opt. Lett., 12, pp. 876–878 (1987), reported passive optical locking of a diode laser to a build-up cavity. In this technique, light from a diode laser is directed into a build-up cavity. If the light has a frequency matched to a cavity resonance frequency, the light is trapped. A portion of the trapped light is then directed back into the diode laser to act as a passive feedback mechanism, which locks the frequency of the low-finesse diode laser to that of the high-finesse build-up cavity, as well as reduces the diode emission bandwidth.

A shortcoming of systems similar to that of Dahmani et al. is that such systems employ weak optical locking: only a very minute portion of the light in the build-up cavity is fed back to the diode laser. The disadvantage of the weak optical locking technique is that it still requires careful electromechanical control of both the magnitude and phase of the light fed back to the diode laser. Additionally, such systems contain at least four reflectors.

Passive all-optical locking of anti-reflection-coated diode lasers to external resonant cavities has recently been exploited extensively. Examples include frequency doubling (W. Lenth and W. P. Risk in U.S. Pat. No. 5,038,352, "Laser system and method using a nonlinear crystal resonator," Aug. 1991; W. J. Kozlovsky et al., "Blue light generation by resonator-enhanced frequency doubling of an extended-cavity diode laser," Aug. 1994, vol. 65(5), pp. 525–527, Appl. Phys. Lett.), frequency mixing (P. G. Wigley, Q. Zhang, E. Miesak, and G. J. Dixon, "High power 467 nm passively-locked signal-resonant sum frequency laser," Post Deadline Paper CPD21-1, Conference on Lasers and Electro-optics, Baltimore, Md., Optical Society of America, 1995), and chemical sensing (David A. King, et al., in U.S. Pat. No. 5,432,610, "Diode-pumped power build-up cavity for chemical sensing," July, 1995). King et al., supra, describe several embodiments in which a diode laser is optically locked to an external resonant cavity.

Additionally, King and Pittaro (application Ser. No. 08/619,877, HP Docket 10960224-1, filed Mar. 20, 1996, which is incorporated by reference in its entirety herein) disclose a three mirror structure where optical locking occurs between an external high-finesse buildup cavity and a cavity containing a laser gain medium. Their optical locking can be achieved in a passive manner by means of an optical nonlinearity of the gain medium. They describe examples where the gain medium is a diode laser. King and Pittaro discuss the differences between conventional external cavity diode lasers and a three mirror system.

To illustrate the difficulty of passive all-optical locking of diode laser, a brief description of the physics of an optical cavity is given in the following. As depicted in FIG. 1, two reflective surfaces 2 and 4 (with reflectivities (i.e., reflection coefficients) $R_2$ and $R_3$ respectively) define a cavity 6. This cavity 6 has a comb of resonant frequencies where the comb spacing is $c/2L$ (c is the speed of light in the cavity and L is the optical distance between the two reflective surfaces 2 and 4).

Light incident on a linear cavity generally undergoes one of two possible phenomena as depicted in FIG. 1. In FIG. 1A, the frequency of the incident light 8 is far from a cavity resonance frequency. Thus, the incident light 8 is simply reflected as reflected light 10 by surface 2. FIG. 1B depicts the situation when the incident light 8 is at (or very near) a cavity resonant frequency. In this case, the incident light is trapped as an intracavity beam 12 between surfaces 2 and 4. The trapped light additionally leaks through surfaces 2 and 4, affecting the reflected beam 10 and the transmitted beam 14 from the cavity respectively. The leakage is out of phase with the incident beam 8, thus causing a destructive interference with the portion of beam 10 that is simply and nonresonantly reflected from surface 2.

When the incident beam 8 is at a cavity resonant frequency, the total effective reflection coefficient of the cavity 6 is lower than the simple nonresonant reflection coefficient of surface 2. This effect is shown in FIG. 1C, in which the reflectivity of the cavity ($I_{ref}/I_{inc}$) shown in FIG. 1A and FIG. 1B is plotted as a function of normalized frequency. The frequency is normalized to a comb spacing of the cavity such that a cavity resonance occurs for each integral value of normalized frequency. The cavity bandwidth is the full width at half maximum of each resonance and becomes smaller as the reflectivities of surfaces 2 and 4 decrease. When $R_2$ equals $R_3$, the magnitude of the resonant and nonresonant reflections from surface 2 are equal and their phases differ by 180°. In this way, the cavity reflectivity drops to zero (in the absence of scattering) on a cavity resonance.

FIG. 1C shows that the reflected beam 10 (or optical feedback to the gain medium) is the weakest at a cavity resonance. The laser threshold in part depends on the intensity reflected into the gain medium, the larger the reflection, the lower the threshold. Thus, it appears that, by optical feedback, as the diode current is increased, the laser tends to reach threshold at a frequency other than a cavity resonance frequency. Therefore, before King and Pittaro described their system, it has long been believed by those skilled in the art that the structure shown in FIG. 1A is highly unsuitable for frequency-locking of a diode laser. Considering the difficulty in overcoming the threshold situation of FIG. 1C, what is needed is a robust system with a relatively simple structure that passively locks a gain medium in a laser cavity and an external resonant cavity at the same frequency to generate high-intensity light. In the present disclosure, we describe a substantially improved apparatus and technique over those described by King and Pittaro.

SUMMARY

The present invention provides a laser system that includes a first cavity and a second cavity having a common reflector between them. A laser gain medium is contained in the first cavity to emit light, which passes from the first cavity to resonate in the second cavity. These cavities are defined herein respectively as the "laser cavity" and the "external resonant cavity" (or simply the "external cavity"). Typically, the laser build-up system contains three reflectors: a first reflector having a reflectivity ($R_1$), a second reflector spaced from the first reflector to define the laser cavity therebetween, and a third reflector spaced from the second reflector to define the external cavity therebetween. Part of the light passes from the external resonant cavity back into the laser cavity to act on the laser gain medium to optically lock the two cavities to the resonant frequency of the external cavity (i.e., locking the gain medium to the resonant frequency of the external cavity). A light-screening device, such as an aperture, is disposed in the laser cavity to transmit only preferred portions of the light beam reflected from the second reflector to pass more light corresponding to resonance than to anti-resonance of the external cavity to the gain medium. Light of constructive interference passing to the gain medium is light that corresponds to resonance and vice versa. In combination with the nonlinearity of the gain medium, this transmission of a preferred portion of light provides a robust optical locking of the gain medium to the resonant frequency of the external cavity. Preferably, the second reflector has a reflectivity ($R_2$) larger than the reflectivity ($R_1$) of the first reflector. The third reflector preferably also has a reflectivity ($R_3$) larger than the reflectivity of the first reflector ($R_1$) such that the power in the external cavity is substantially larger than that in the laser cavity.

A resonant optical path is one in which a light beam has exactly the same optical properties (phase, frequency and spatial profile) at the beginning and at the end of one round trip along the resonant optical path. By examining the field equations for the three mirror structure described above we find three possible resonant conditions. These conditions occur when the resonant optical paths are (1) the laser cavity, with the external cavity anti-resonant; (2) the external cavity with the laser cavity anti-resonant; and (3) both cavities resonant. The present invention enables a laser to function in the mode of case (2), which is the condition corresponding to optical locking of the gain medium in the laser cavity to the frequency of the external cavity. The reason is that in case (2) the light that leaks out of the external cavity into the laser cavity is amplified by the gain medium and sent back in phase to the external cavity. Here, optical frequency locking occurs when two cavities: (a) the external cavity and (b) the cavity formed between the first and the third reflector, or optical paths are simultaneously resonant, taking into account the phase shift that the second reflector adds to the light path. The presence of a light-screening device, such as an aperture, allows this optical locking to occur.

Using such a system, a method for producing a high-intensity laser light is provided. In this method, light emitted from the laser gain medium in the laser cavity enters the external resonant cavity, resonating therein to reach high intensity. Light leaks from the external resonant cavity towards the gain medium. A preferred portion of light coming from the second reflector that favors resonance in the external cavity is transmitted from the external cavity through a light-screening device, e.g., an aperture, to the gain medium to optically lock the laser gain medium to a resonant frequency of the external resonant cavity by strong optical feedback.

Robust and stable optical locking is provided for by two factors. First, the round trip optical path length of the external cavity has to be an integral number of wavelengths and that of the laser cavity must be an integral number and a half wavelengths (considering transmission through the second reflector) at a resonant frequency of the external cavity.

A second factor for stable optical locking is that the laser threshold be lowest at a resonant frequency of the external cavity. The laser threshold depends on the inverse of the reflection coefficient from the first and second reflectors into the gain medium. As shown in FIG. 1C, for plane waves the reflectivity of the external cavity is lowest at a cavity resonant frequency, forcing the laser threshold to be a maximum at these frequencies.

As used herein, the term "reflectivity" or "reflective coefficient" of an object or a system as viewed by a viewer is the ratio obtained by: intensity of the light received by the viewer coming from the object or system divided by the intensity of the light transmitted from the viewer to the object or system, when no other light source is included. In effect, the object or system is considered as a "black box" or "mirror" that reflects light. Thus, a reflective structure consisting of an external cavity and an aperture placed according to the invention can be viewed as a "mirror" positioned at the location of the aperture reflecting light with a reflectivity, $r_a$, that is a function of frequency. Likewise, with the gain medium emitting light, light that passes from the direction of the second reflector toward the gain medium is considered to be reflected although this reflected light is due to the combined effect of light leaking back from the external cavity at resonance and light simply reflected from the second reflector (i.e., corresponding to anti-resonance). The reflectivity of such mirrors is now largest at the frequencies corresponding to a resonant frequency of the external cavity. When such a mirror is used as one reflector of a simple laser cavity the entire system may generate radiation at one or more external cavity resonant frequencies because the laser threshold is lowest at a resonant frequency of the external cavity.

Most laser systems employ optical beams with defined beam shapes. If a beam other than a plane wave is incident on the cavity shown in FIG. 1B then the reflected beam may have a different beam shape. The shape of the total reflected electric field is the sum of the shape that is reflected by the second reflector and the field that leaks out of the cavity. The optical phase difference between these two fields results in destructive and constructive interference patterns in the total beam that is reflected from the cavity. For example, for a Guassian light beam emitted from the gain medium, the reflected beam profile may have a higher intensity along the axis of propagation than the incident beam. If the shape and reflectivities of both reflectors are chosen according to the invention then a portion of the beam reflected from the external cavity in FIG. 1B may have a larger intensity than the same portion reflected from the external cavity in FIG. 1A (where the beam is simply reflected from the second reflector). If an aperture, or another suitable light-screening device, is placed according to the invention such that it selectively passes the more intense portion of the reflected beam (corresponding to constructive interference) then the reflectivity of the cavity viewed through the aperture is dramatically modified, with the largest reflectivity now at a cavity resonance frequency.

In the present invention we provide an improved laser over that of King and Pittaro. As stated in the above, our laser system can include a structurally simple aperture. More preferable is an adjustable aperture, whose shape can be matched to the interference in the total reflected beam from the cavity. The aperture profile together with the profile of the reflected beam ensure that optical locking will occur under a greater variety of conditions and permitting an optimum condition to be found.

Furthermore, in the present invention, because the laser gain medium is not located inside the external cavity, a very high-intensity (power) light can be present in the external cavity without causing damage to the laser gain medium. The high reflectivity of the reflectors enables light to be reflected in multiple passes in the external cavity, thereby allowing a narrow bandwidth without requiring a long cavity length. With this invention, a high-intensity laser light source can be made with a theoretical minimum number of components (including optical elements, such as reflectors, and electromechanical elements to fine-tune the position of the optical elements). The intensity in the external resonant cavity can be one or more orders of magnitude higher than that of the laser cavity and can be 10 to $10^5$ as high as that emitted by the gain medium. Additionally, the narrow bandwidth external cavity has a temporal averaging effect on the diode emission, minimizing fast fluctuations (the external cavity can be thought of as an optical capacitor). Therefore, the present invention is uniquely suitable to provide a compact high-intensity light source.

The high-intensity light made available in the laser build-up system or method of the present invention has a variety of applications. Examples include but are not limited to the following: (1) diode laser mode cleanup—where a well characterized output beam is required from one or more solid state sources; (2) chemical or gas sensing (e.g., as described by King et al., supra, and U.S. Pat. No. 5,437,840 (King et al.)); particle counting; nonlinear frequency generation (e.g., using a nonlinear medium inside the external cavity); environmental sensing; and distance measurement.

BRIEF DESCRIPTION OF THE DRAWING

The following figures, which show the embodiments of the present invention, are included to better illustrate the present invention. In these figures, like numerals represent like features in the several views.

DETAILED DESCRIPTION OF PREFERRED EMBODIMENTS

In the present invention, a second reflective surface (or reflector) is disposed between a first reflective surface (or reflector) and a third reflective surface (or reflector) to define a laser cavity (which contains a laser gain medium) and an external cavity. Light is generated by the gain medium in the laser cavity and passes into the external cavity where it resonates and passes back to the laser cavity to provide feedback to the gain medium. A mechanism to screen light is used to ensure that the reflectivity viewed by the gain medium in the direction of the external cavity is greater at the resonant frequency of the external cavity than at any other frequency. Light entering the laser gain medium this way will act on the gain medium by means of the gain medium's nonlinearity to passively lock the gain medium in the laser cavity to emit light at the resonant frequency of the external cavity.

Figure 2:
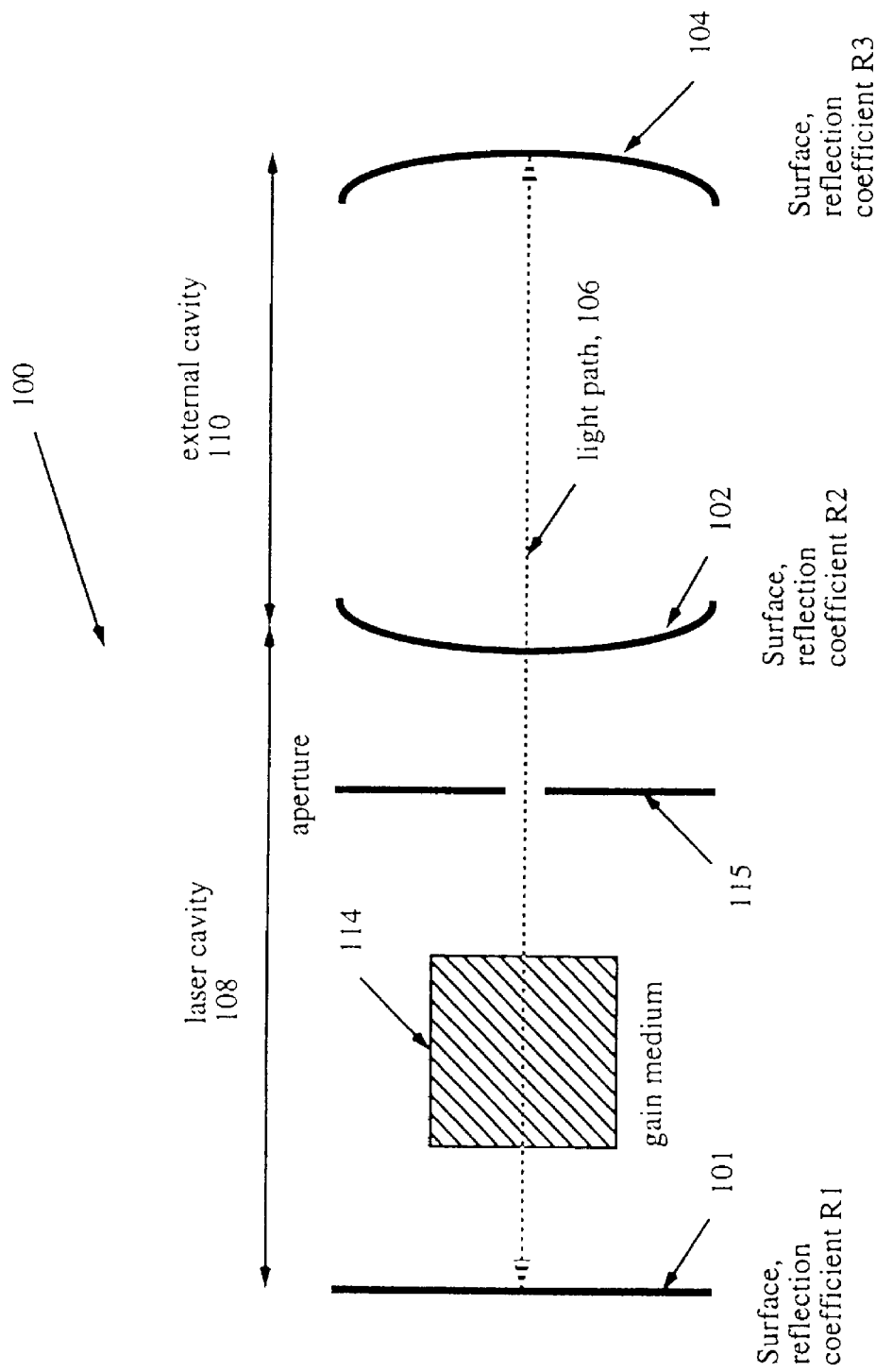
FIG. 2 is a schematic representation of an embodiment of the laser system of the present invention.

A first preferred embodiment of the laser build-up system is shown in FIG. 2. Three reflectors (or mirrors) 101, 102, and 104 are arranged in the laser system 100 so that light may travel between them on a straight light path (represented by axis or line 106). The reflectivities of the three surfaces 101, 102, and 104 are $R_1$, $R_2$, and $R_3$, respectively. A laser cavity, 108 (in this case a two-mirror optical cavity) is defined between reflectors 101 and 102. Reflectors 102 and 104 define another two-mirror cavity, the external cavity 110. An optical gain medium (or laser gain medium) 114 is disposed in the laser cavity 108 in such a way that it amplifies light traveling along axis 106 without introducing any substantial additional reflection. This can be done by anti-reflection-coating the facets of the gain medium 114 to eliminate reflection. One alternative way to avoid reflection from the gain medium is to chamfer its facet(s). Reflective surfaces 102 and 104 are shaped or curved to form a stable optical spatial mode in the external cavity 110. The resonant nature of the external cavity provides that the shape of the beam reflected from the external cavity is a function of the light frequency. An aperture 115 is disposed in the laser cavity between the gain medium 114 and reflector 102.

A round, hard-edged aperture is used herein as an illustrative device for screening light coming from the second reflector 102 and the external cavity 110 to discriminate the light at resonance and at anti-resonance frequencies of the external cavity. It is to be understood that other devices, such as a lens or a transparent plate with darkened or blocked regions, a lens with a relatively planar central region to transmit light along the optical axis with curved radially outer regions to direct light from the outer region away from the gain medium, and the like, can be used because such devices perform the function of an aperture here. Such devices are considered to be "apertures" herein. In fact, the emission facet of a diode laser, if small enough to function as an aperture to screen light as described herein, can be considered "an aperture" as well.

The transmissive portions of aperture 115 is shaped to optimize the transmission of more light at a resonant frequency of the external cavity from the laser cavity to the external cavity and at the same time allow a greater ratio of reflectivity at resonance to reflectivity at anti-resonance of the external cavity 110 as viewed by the gain medium 114. Above laser threshold the gain medium and cavity 110 will be passively optically locked and the light in cavities 108 and 110 will have the same optical properties (i.e frequency, bandwidth, and phase) when (1) the system exhibits an optical nonlinearity affecting the optical path length of either the external cavity or laser cavity or both, (2) shapes or curvatures of the aperture 115 and reflectors 102 and 104 are chosen to form a stable optical mode, and (3) values of $R_2$ and $R_3$ are selected such that the beam reflected from reflector 102 exhibits destructive and constructive interferences. The selection of reflector shape, curvature and spacing to obtain a stable optical mode is known in the art.

Since the two cavities are optically locked, the optical properties of the light in the laser cavity 108 are determined by the light in the external cavity 110. In addition, when $R_2$ and $R_3$ are much greater than $R_1$ the light intensity in the external cavity 110 will be larger than the light intensity in the laser cavity 108. Several types of optical nonlinearity may provide a change in the optical path length of either of the cavities in the system. One preferred example is through the linewidth enhancement factor that is present in diode laser gain media. This factor results in a nonlinearity between the gain and optical path length of the diode laser, as is done by King and Pittaro, supra. Another example is to make use of optical heating of a gas that is inside the external cavity to provide nonlinearity, as described by Dube et al. (J. Opt. Soc. Am. B., vol 13, p 2041, 1996).

The threshold for generation of laser radiation in system 100 depends on the inverse of r, the total reflectivity measured (or viewed) at the gain medium 114, of the light traveling along path 106 in the direction towards reflector 102 and the external cavity and reflected back. In the present invention, system 100 will lase under conditions when the threshold is the lowest or, equally, when r is the largest, i.e., at a maximum.

Figure 1A:
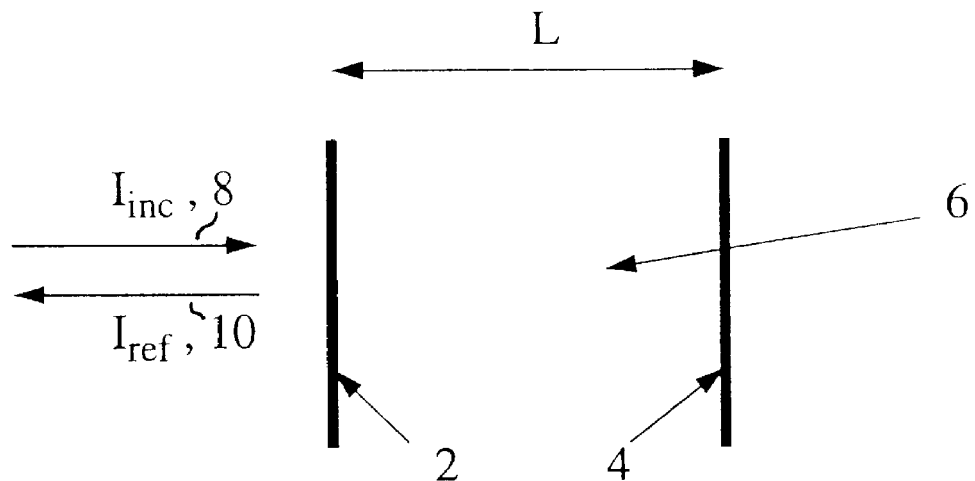
FIG. 1A is a schematic representation of light incident on an optical cavity without resonance.
Figure 1B:
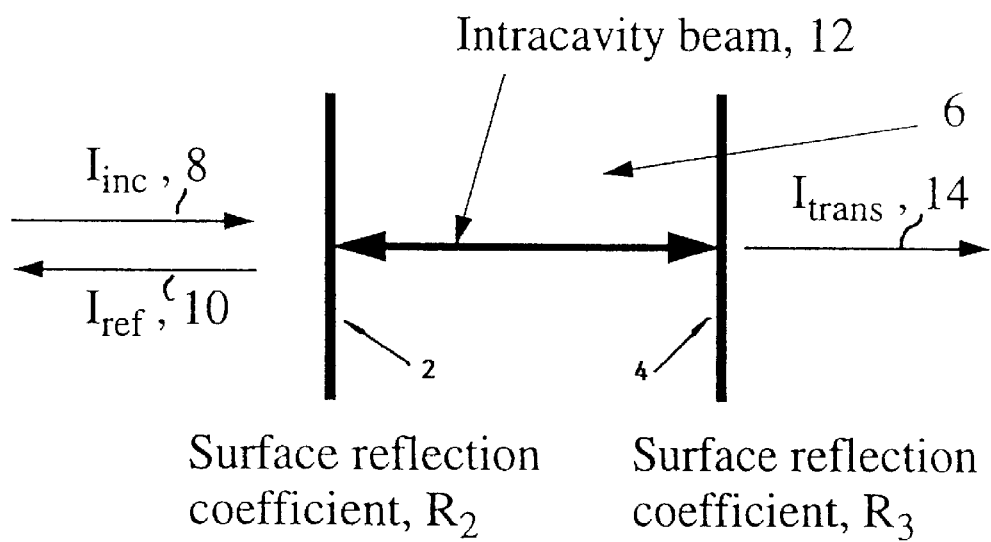
FIG. 1B is a schematic representation of light incident on an optical cavity with resonance.
Figure 1C:
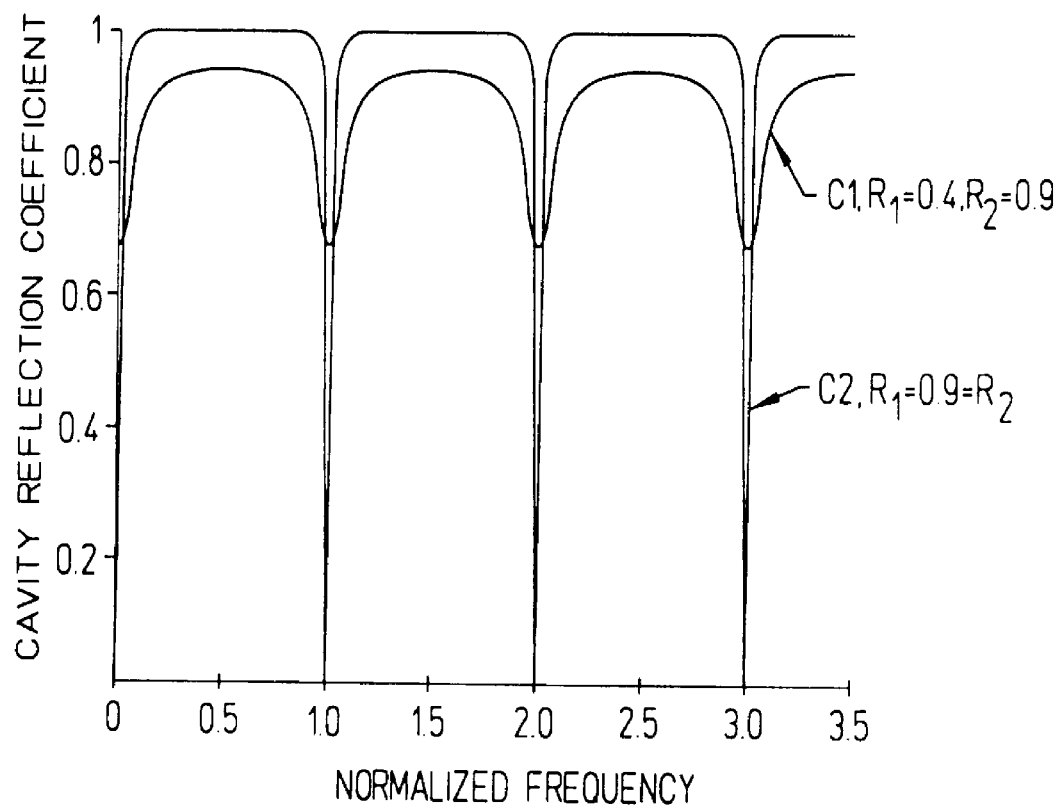
FIG. 1C is a graphical representation of cavity reflection related to normalized frequency showing the effect of reflectivities of the reflectors in an optical cavity.

Fundamentally, the total reflectivity of an optical cavity is always a minimum at a cavity resonant frequency (as indicated in FIG. 1C) irrespective of the profile of the incident or intracavity beams. At a cavity resonant frequency some incident light will buildup in the cavity and leak through the end mirror, acting as an energy loss to the system. At other frequencies the intracavity buildup is lower, less energy is lost and more energy is reflected. However, in the present invention the value of r is largest at a resonant frequency of the external cavity 110, resulting in the lowest laser threshold at this frequency and stable, passive optical locking of cavities 108 and 110. The reversal of states (locking vs no locking) is accomplished by selectively blocking portion(s) of the beam reflected from the cavity as described below.

The following discussion highlights the frequency dependence of the shape of the beam reflected from an optical cavity. In FIG. 1A the incident beam is at a cavity antiresonant frequency, no intracavity beam exists, and the total reflected beam depends solely on the curvature and shape of surface 2. In contrast, in FIG. 1B the incident beam is at a cavity resonant frequency and the beam reflected from surface 2 now consists of a coherent superposition of the beam directly reflected from surface 2 and the intracavity beam 12 that leaks through surface 2. We have discovered that, as previously stated, generally there are destructive and constructive interferences in the optical beam shape that is reflected from surface 2 in FIG. 1B so that the total reflected beam shape may be different from that of the incident beam. In this case the shape of the total reflected beam depends not only on the curvature and shape of surface 2, but through the interaction with the intracavity beam, also on the curvature and shape of surface 4.

The total intensity reflected from surface 2 is larger in FIG. 1A than in FIG. 1B. However, we have discovered that (a) an appropriate choice of $R_1$ and $R_2$ and (b) the stable optical mode between reflecting surfaces 2 and 4, which is a function of the curvature and shape of these surfaces, allows a larger intensity in portions of the total reflected beam in FIG. 1B than in the same portions in FIG. 1A. This beam shape pulling is a result of the constructive and destructive interferences discussed earlier. Placing an aperture with a shape that permits the constructive portions of the reflected beam to pass changes the reflectivity, $r_a$, of the cavity as viewed through the aperture.

With this arrangement, $r_a$ is largest when the frequency of the incident light is at a cavity resonant frequency. The function of the aperture is to provide discrimination between the resonant and anti-resonant conditions of the external cavity. To achieve a maximum intensity in the external cavity, 110, of FIG. 2, the shapes of (1) aperture 115, (2) beam in the laser cavity, and (3) surfaces 102 and 104 are preferably chosen to pass as much light as possible along path 106 from the gain medium 114 to surface 102, while providing the largest value of $r_a$ to be at a resonant frequency of the external cavity 110. The aperture 115 in one cavity (laser cavity) provides discrimination of states of operation of another resonant cavity. Preferably, the aperture 115 provides discrimination between the resonant and anti-resonant conditions and permits as much light as possible to pass from the gain medium to the cavity and vice versa.

Figure 3:
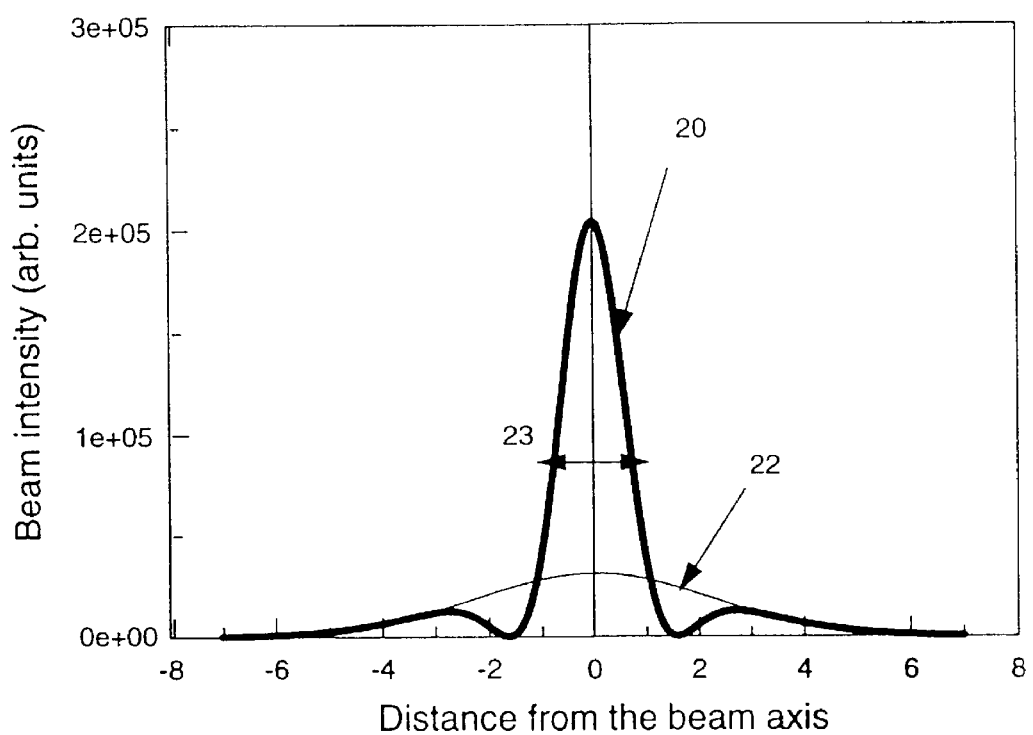
FIG. 3 shows the relation of the radial distance from the beam axis to the intensity of reflected light by the external cavity at the light-screening device for resonance and anti-resonance for another embodiment of laser system of the present invention.

Both these conditions may be accomplished with an aperture that contains one or more (1) hard edges (straight or curved), (2) regions that are shaded, or (3) regions that have graded attenuation. As shown in FIG. 3, the light reflected from the external cavity 110 has different intensity profiles when the external cavity is at resonance (curve 20) and at anti-resonance (curve 22). The gain medium will only lase at the resonant frequency of the external cavity 110 when the intensity as viewed by the gain medium is greater than that at an anti-resonance frequency. In this embodiment, only at certain radii of the beam reflected by the second reflector is the intensity higher at resonance than at anti-resonance, e.g., region 23 of FIG. 3. Thus, to permit passive locking of the system, it is preferred that the aperture, or light-screening device, allows light to pass into the gain medium at these certain radii of higher intensity and blocks light transmission at the other regions.

Figure 4:
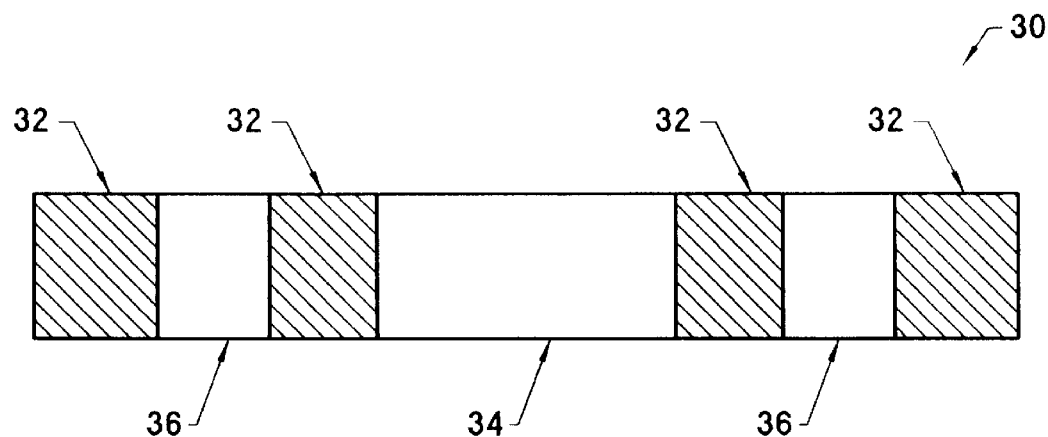
FIG. 4 shows a transparent plate with dark regions and clear regions to function as an aperture.
Figure 5:
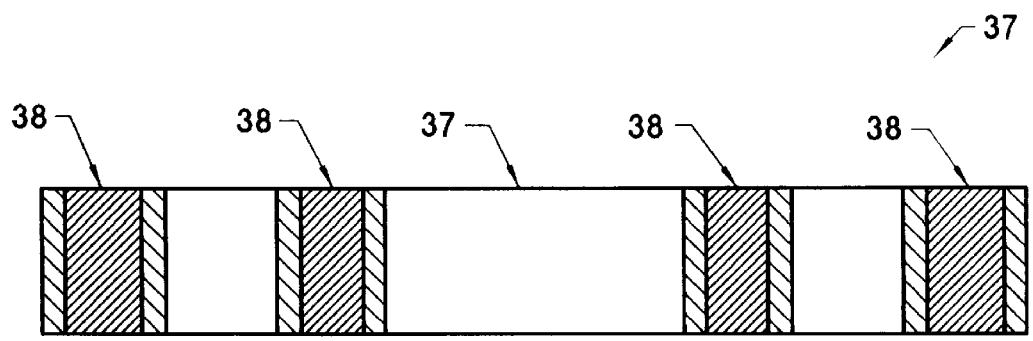
FIG. 5 shows a transparent plate having regions with graded darkening and clear regions to function as an aperture.

This selective transmission can be done with a simple aperture, or iris, or as shown in FIG. 4, with a plate 30 having a central transparent region 34 and concentric dark regions 32. In some cases with a high intensity annular constructive interference region, an annular transparent region 36 concentric with the dark regions can be used. FIG. 5 shows an embodiment of the light-screening device 37, similar to the plate 30 of FIG. 4, except that the dark regions 38 are graded in transparency. This graded darkening can be done to optimize the amount to light passing from the gain medium through the light-screening device to the external cavity 110 and at the same time obtain a large $r_a$, the reflectivity of the cavity 110 through the aperture. To have passive optical locking, $r_a$ should be at a maximum at a resonance frequency of the external cavity. To facilitate robust passive frequency locking, the preferred range of $r_a$ is from about 0.01 to 0.5, more preferably about 0.05 to 0.5.

Another important parameter for optical locking is ρ, the ratio of $r_a$ when the external cavity is at resonance to $r_a$ when the external cavity is at anti-resonance. When ρ<1 more light returns to the gain medium at an external cavity anti-resonance and the system will lase with the laser cavity 108 resonant and no (or very little) light in the external cavity. This condition corresponds to case (1) discussed earlier and does not correspond to frequency locking. When ρ>1 more light returns to the gain medium at an external cavity resonant frequency, and lasing will occur with large power in the external cavity together with amplification of light in the laser cavity. This condition corresponds to optical locking of the gain medium to the external cavity and case (3) discussed earlier. ρ must be larger than 1 for passive optical locking to occur. For robust passive locking, preferably, ρ is from about 1.1 to 2 to ensure optical locking that is stable against environmental influences.

In this invention, to provide high power in the external cavity, preferably, $R_1$ is about 0.1 to about 0.99, $R_2$ is about 0.9 to about 0.999999, and $R_3$ is about 0.9 to about 0.999999. For some applications, such as chemical analysis (e.g., similar to the technique used in King et al, U.S. Pat. No. 5,432,610), more preferably, to provide higher intensity light in the external cavity, $R_1$ is about 0.1 to about 0.99, $R_2$ is about 0.995 to about 0.999999, and $R_3$ is about 0.995 to about 0.999999. For some other applications, such as intra-cavity nonlinear generation of light, the preferable values are between 0.1 and 0.99 for $R_1$, between 0.8 and 0.999999 for $R_2$, and between 0.8 and 0.999999 for $R_3$. In addition, to have stronger optical feedback, it is preferable that $R_1$ is less than $R_2$, which is preferably less than $R_3$ (i.e., $R_1<R_2<R_3$). The curvature and separation of reflectors 102 and 103 are chosen to form a stable optical mode in a well known manner such that the beam reflected from reflector 102 exhibits destructive and constructive interferences. The openings in aperture 115 are chosen to substantially pass the portions of the beam which exhibits constructive interferences and substantially block the destructive portion. The aperture can take different shapes and forms, examples of suitable apertures include round and square, with one or more hard edges, and the emission facet of the gain medium.

Figure 6:
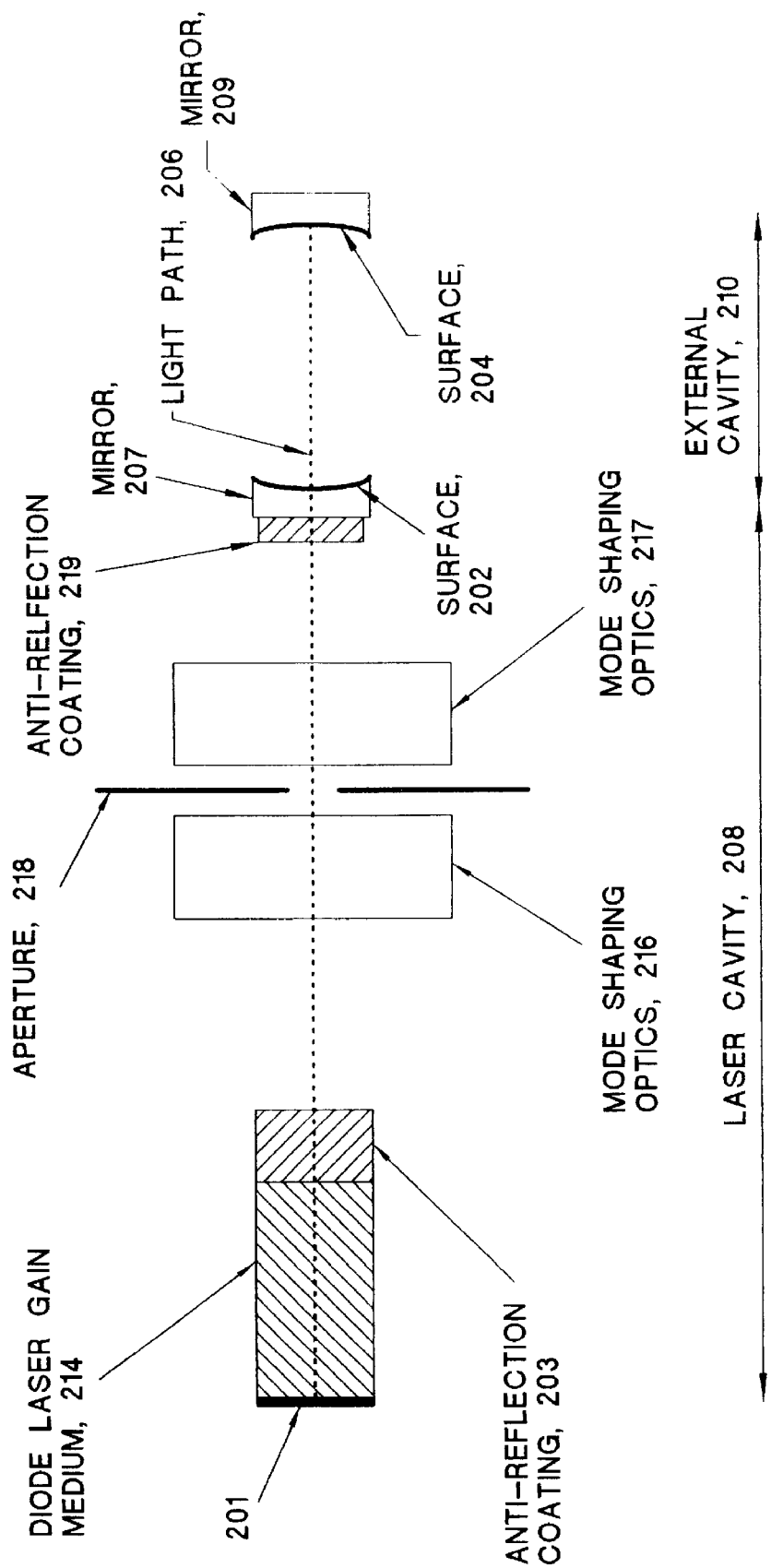
FIG. 6 is a schematic representation of yet another embodiment of the laser system of the present invention, having mode-shaping optics on both sides of the light-screening device.

FIG. 6 shows another preferred embodiment. Here, the gain medium is incorporated into the structure of a semiconductor diode laser 214. The back facet of the laser is coated to be reflective and forms surface 201. The emission facet 203 of the diode laser is anti-reflection (AR) coated, with reflectivity preferably in the range of less than 0.001. Reflective surfaces 202 and 204 are coated onto reflectors (substrates) 207 and 209, respectively. These surfaces have appropriate curvatures to support a stable spatial mode in external cavity 210 formed between surfaces 202 and 204. The surface 219 of reflector (substrate) 207 facing the laser cavity 208 is preferably anti-reflection-coated with a reflectivity in the range about 0.04 to 0.001.

Alternatively, the surface 219 can be a chamfer at an angle with the light path 206 to reduce its light reflection into the gain medium. Mode shaping optics 216 and 217 can consist of lenses and prisms. Optics 216 collects and images the diode emission through the aperture 218, while optics 217 collects and images the light from the aperture 218 into the external cavity 210.

EXAMPLE

In this illustrative example of the embodiment depicted in FIG. 6, the diode laser 214, is a Toshiba 9225 which has an anti-reflection coating 203, with a reflectivity in the range 0.0001. The mode shaping optics 216 consisted of a 4.8 mm focal length 0.48 NA spherical lens, 25.4 mm and −12.7 mm cylinder lenses, and a microscope objective. The 4.8 mm lens was adjusted to form a collimated beam from the diode laser and mounted in conjunction with the diode laser. The two cylinder lenses acted as a telescope for the fast axis of the diode emission, and were located so that the fast axis length was reduced by approximately a factor of 2. The microscope objective imaged the circularized beam formed by the cylinder lenses onto the aperture 218. The aperture 218 was circular with a diameter of 25 microns.

Mode shaping optics 217 consisted of a single spherical lens with a focal length of 25.4 mm. This lens imaged the waist of the beam in the aperture to a new location approximately 23 cm from the lens and with a waist size of approximately 72 microns. The performance of the system varied depending on the curvature and reflectivities of the reflectors 207 and 209. In this example both reflectors were spherical with an equal radius of curvature of 10 cm. The reflectivities of surface 202 and 204 are 0.999355 and 0.99999 respectively, and the reflectors 207 and 209 were obtained from Research Electrooptics, Inc. (Boulder, Colo.). In this example the distance between the surfaces 202 and 204 was 4 cm, but other distances may work equally well.

To show the operation of the invention, we used the equipment in the present example and recorded the spatial profile of the optical beam reflected from reflector 207 under various conditions. A very weak beam splitter was placed between mode shaping optics 217 and reflector 207 and the intensity profile of the reflected beam was recorded using a video camera. The reflected beam profiles are shown in FIG. 7.

Optical components 214, 216, 217, and 218 are all aligned centrally to a single optical axis 206. Reflectors 207 and 209 were aligned so that their respective center of curvature fell on light path 206. This alignment ensured that the beam in the external cavity 210 had a lowest order Hermite Gaussian (TEMOO) profile with a waist of 92 microns centrally located between the two reflectors on the beam path 206. The external cavity was translated along the light path 206 and the reflected beam profile was recorded at several locations. In the case of FIG. 7 the distance between the lens 217 and surface 202 was 8 cm.

Figure 7A:
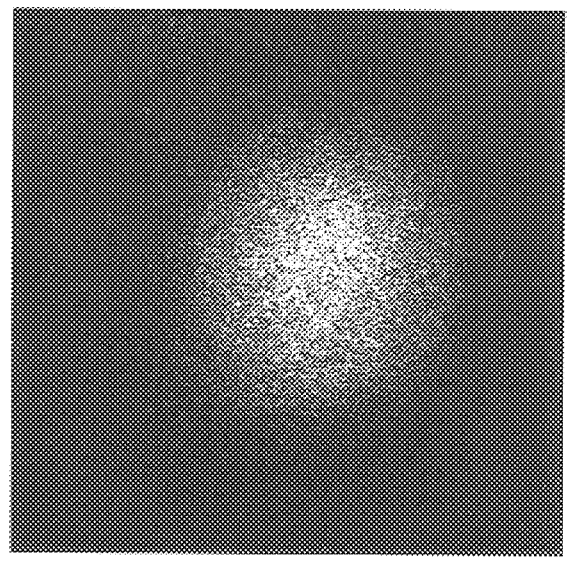
FIG. 7A is a picture of the intensity of the beam reflected by the external cavity at anti-resonance of the embodiment of the laser system of FIG. 6, with the intracavity beam in the external cavity blocked.
Figure 7B:
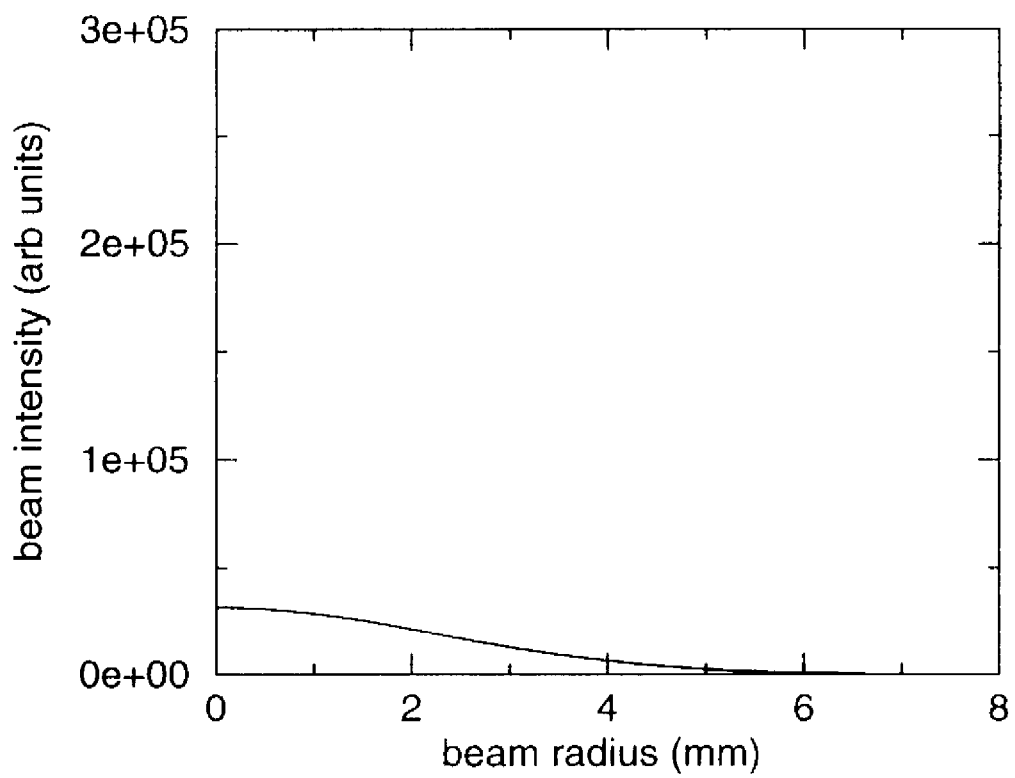
FIG. 7B is a graph of the calculated intensity profile of the beam of FIG. 7A.

The intensity profile of the beam reflected from reflector 207 is shown in FIG. 7A when the reflector 209 was blocked. This condition corresponds to a lasing condition from the simple and direct reflection from surface 202 alone and to a cavity anti-resonance, i.e. no intracavity beam. The calculated beam profile is shown in FIG. 7B, where the optical intensity, in arbitrary units, is plotted as a function of beam radius. In this example, the beams are all cylindrically symmetric. The reflected beam in this case was a simple TEM00 beam with a waist of different size and location compared to the incident beam.

Figure 7C:
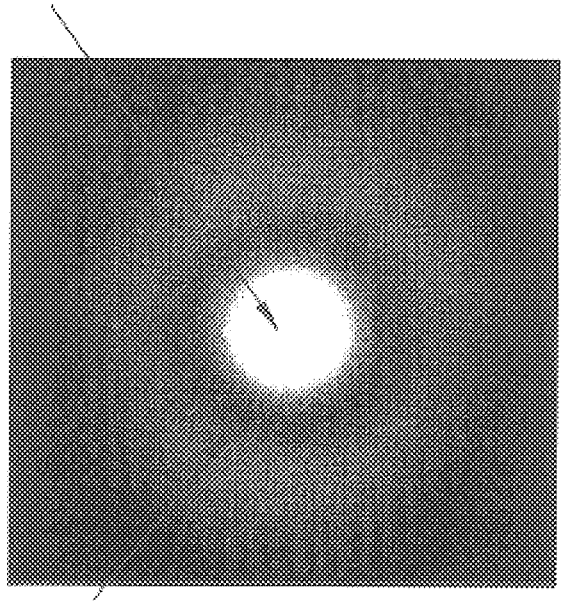
FIG. 7C is a picture of the intensity of the beam reflected by the external cavity at resonance of the embodiment of the laser system of FIG. 6.
Figure 7D:
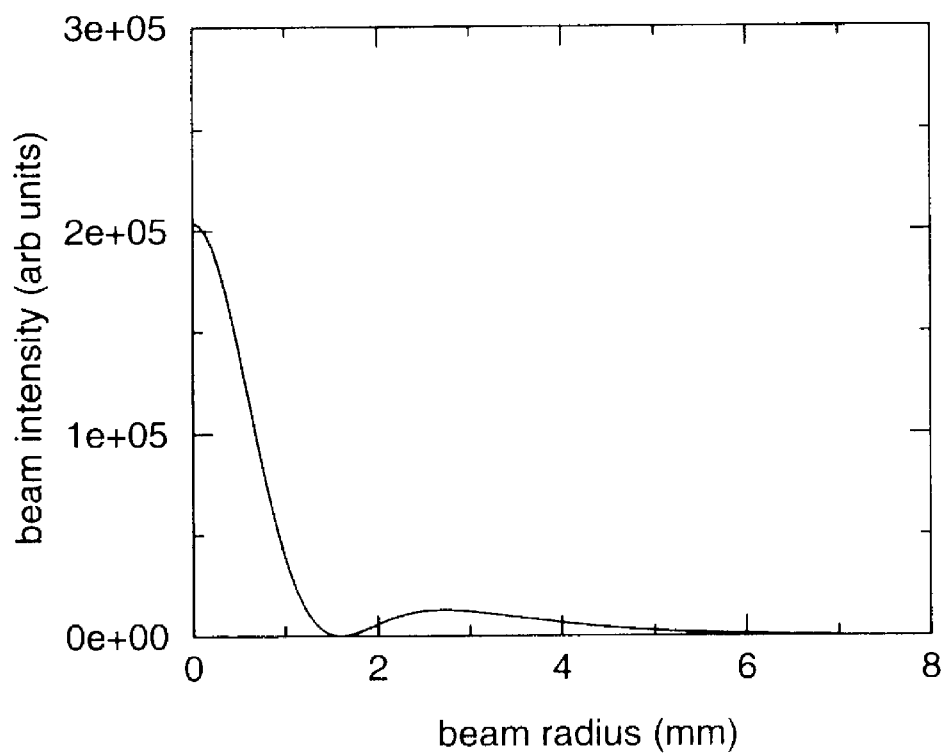
FIG. 7D is a graph of the calculated intensity profile of the beam of FIG. 7C.

In contrast, FIG. 7C shows the beam reflected from the second reflector 207 when the third reflector 209 was unblocked, and an intense intracavity beam was present in the external cavity under passive locking condition. The measured values and the calculated radial intensity profile shown in FIG. 7D both show that destructive (e.g., region 230D) and constructive (e.g., region 230C) interferences exist in this reflected beam. It is noted that the central portion of the beam in FIGS. 7C and 7D is more intense than the same portion of the beam in FIGS. 7A and 7B. The reflected beam was imaged back to the aperture by mode shaping optics 217. In this case the aperture passed substantially the central portion of the beam, blocking the rest to ensure that the reflected intensity at the diode laser was larger at a cavity resonance compared to the simple reflection from the second reflector 207.

Figure 8A:
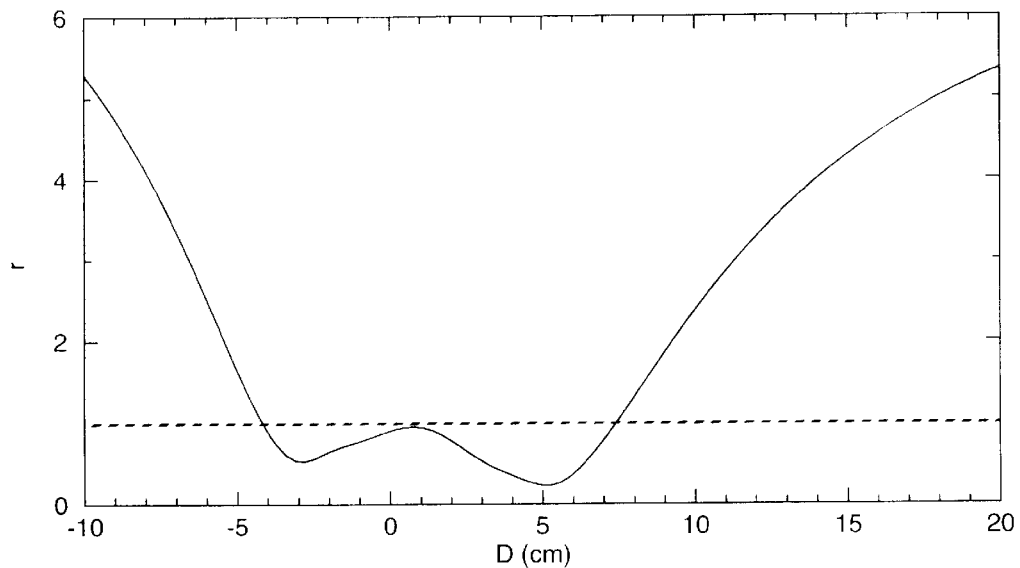
FIG. 8A is a graphical representation of the reflectivity at the gain medium for a cavity resonance divided by the coefficient for a cavity anti-resonance calculated as a function of distance, D, between the incident beam waist and center of the external cavity.

As the cavity 210 is translated along the optical axis towards the aperture, the reflectivity of the cavity viewed through the aperture varies. FIG. 8A shows the calculated variation of ρ, the ratio of the cavity reflectivity viewed through the aperture at a cavity resonance to that at a cavity anti-resonance as a function of distance, D, between the external cavity center and the incident beam waist. When ρ>1 the reflection at the diode laser from reflector 207 is largest at a cavity resonance and the system will have the lowest threshold there and robust optical locking will occur. At the perfect mode matched condition, D=0, as shown in FIG. 8A, ρ<1 and thus no intracavity beam exists in the external cavity, i.e. no optical locking.

Figure 8B:
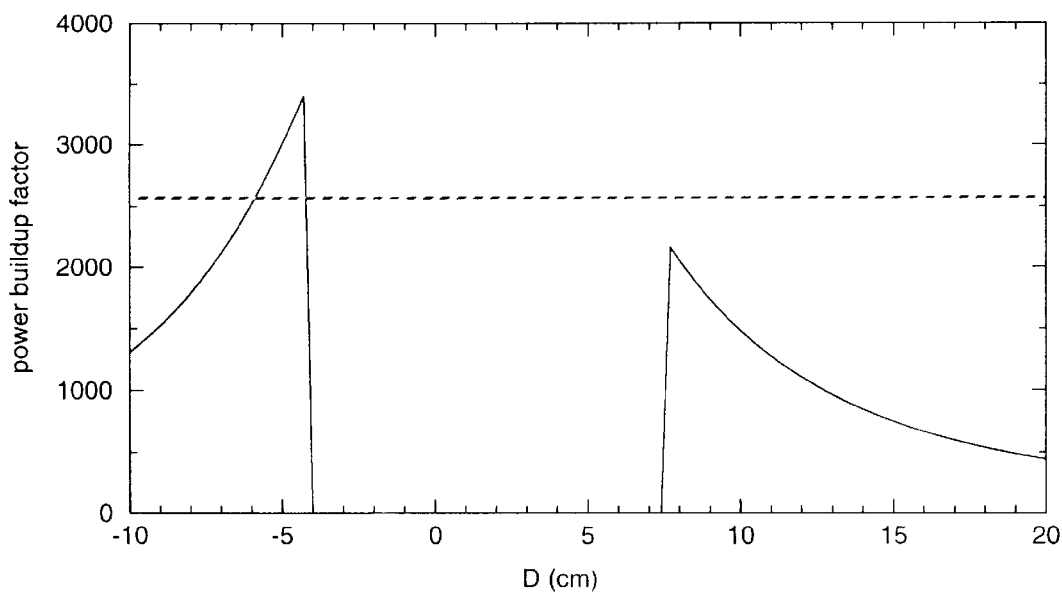
FIG. 8B is a theoretical plot of the cavity buildup factor calculated as a function of D.

As the cavity is moved towards the aperture 218, ρ becomes greater than 1 when D>7 cm. Thus, optical locking occurs again. The power in the external cavity when optical locking occurs depends on the overlap of the incident beam and the intracavity beam, which in turn depends on the external cavity location along the optical axis. The calculated power of the beam in the external cavity equals the power in the incident beam multiplied by the power buildup factor. The power buildup factor is plotted in FIG. 8B as a function of D. FIG. 8B shows that the optimum location is achieved for D of about −5 cm. The horizontal dashed line in FIG. 8 B corresponds to the power buildup factor of a prior art three-mirror power build-up cavity in which the input coupler is half as transmissive as that used in the above setup of FIG. 7 and under perfect mode matched conditions. In the region of D about −5.6 cm the power buildup factor of the two-mirror build-up cavity of the present invention is larger than that in the prior art three-mirror build-up cavity. This represents a significant advantage over prior art since a larger power is achieved with fewer components and the larger transmission of the second reflector in the two-mirror cavity design makes that cavity twice as resistant to reflector scattering effects.

Other Embodiments

Figure 9A:
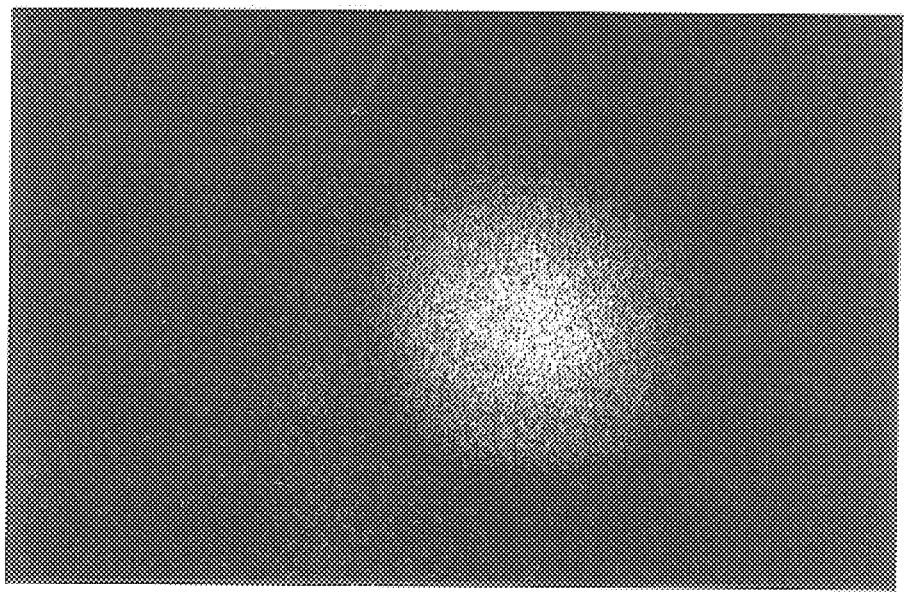
FIG. 9A is a recorded image of the intensity shape or profile of the optical beam reflected from an external cavity with the intracavity beam blocked where the cavity reflectors have been aligned on an axis slightly off the beam path.
Figure 9B:
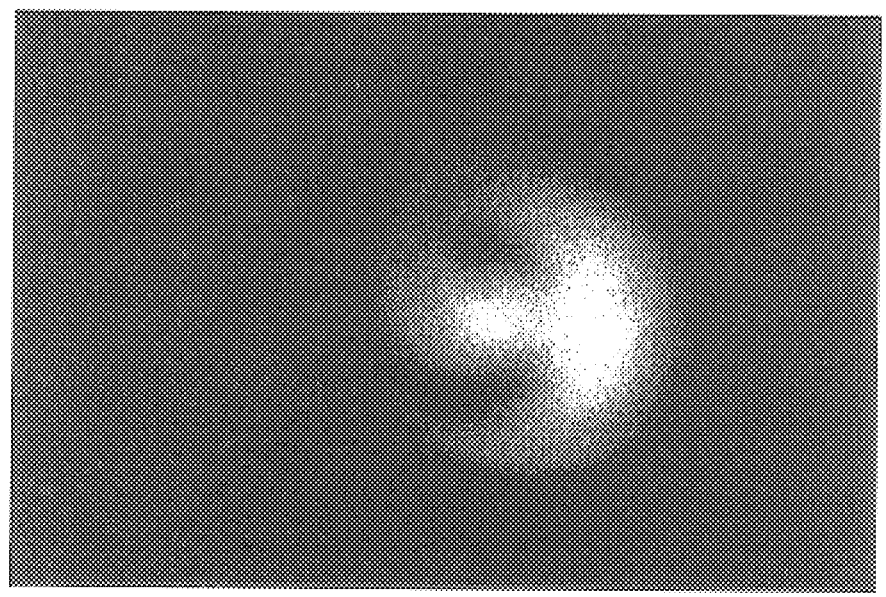
FIG. 9B is a recorded image of the intensity shape or profile of the optical beam reflected from an external cavity with the intracavity beam unblocked where the cavity reflectors have been aligned on an axis slightly off the beam path.

Several alternative techniques can be used to obtain interference effects in the reflected beam from the external cavity. In one of such alternatives the components are identical to those shown in FIG. 6 except that the center of curvature of reflectors 207 and 209 do not lie on the light path 206, but on an axis that makes a very small angle to the light path. The result is shown in FIG. 9, where the center of the cavity is now at a distance D=6 cm from the waist of the incident beam. The recorded image of the intensity shape or profile of the optical beam reflected from the external cavity with the beam in the external cavity 210 blocked is shown in FIG. 9A. The result when the intracavity beam is unblocked is shown in FIG. 9B, which exhibits interference effect. The presence of strong optical locking and a bright beam in the external cavity is evidenced by the substantial difference between FIG. 9A and FIG. 9B. The aperture 218 passes the brighter portion of the beam, thus screening out the destructive-interference part of the beam. At this cavity location, with the reflectors 207 and 209 aligned such that each of their center of curvature lies on the light path 206, FIG. 8A shows that ρ<1 and there should be no beam in the external cavity. This behavior was confirmed in operation.

The simple two cavity laser described in King and Pittaro (application Ser. No. 08/548,787), supra, which uses a Philips CQL801D diode laser with a GRIN lens is similar to the embodiment shown in the present FIG. 6. There, the emission facet of the diode laser additionally acts as aperture in effect and the mode shaping optics 216 is absent. The effective aperture in the King and Pittaro embodiment is fixed and non-adjustable. In addition, the aperture is rectangular because that is the shape of the diode emission facet. If an additional aperture according to the present invention were added to the King and Pittaro device, more discrimination could be advantageously made between the anti-resonant and resonant lasing conditions, allowing larger power to buildup in the external cavity. An alternative modification to the embodiment of King and Pittaro that takes advantage of the invention disclosed herein is to design the diode laser so that its emission facet acts as a better aperture to provide larger light discrimination between external cavity resonance and anti-resonance according to the present invention.

Various embodiments described in King and Pittaro can be readily adapted for the present invention by one skilled in the art. These include embodiments with frequency limiting devices inserted into the laser cavity, e.g., a narrowband transmission filter, frequency limiting device, and where the use of embodiments of the invention is for frequency conversion, distance measurement, and chemical and Raman-based gas analysis. In some applications it may be preferable to replace the anti-reflection coating 219 with a dielectric thin film transmission filter.

As previously stated, a significant portion of the light incident on the external cavity (e.g., cavity 110) passes back into the laser cavity (e.g., cavity 108) through the reflective surface (e.g., reflector 102) to optically lock the gain medium. Depending on the application and the amount of light leaving the external cavity (e.g., through the reflective surface 104), the amount of light returning to optically lock the gain medium can vary. Generally, this amount is about 3% to about 90%; and preferably, because of optical limitations of commonly available optical elements, about 10% to about 50%. Thus, this results in strong optical feedback for all-optical, passive locking of the gain medium to the resonant frequency of the external cavity. A suitable gain medium has adequate nonlinearity such that it can be optically locked to the external cavity with strong optical feedback. Although, because of its large nonlinearity, a diode laser is the preferred gain medium, other nonlinear gain media, such as titanium-doped sapphire, organic material, and the like, can be used.

Adjusting the Distance between the Second Reflector and the Third Reflector

To tune the resonant frequency of the external cavity (for a narrow bandwidth), the distance between the second and the third reflector can be adjusted by thermal expansion and contraction of the structure that supports these two reflectors, as described by King and Pittaro, supra. Due to the robustness of the system of the present invention in embodiments where p is significantly larger than 1, the passive lock of resonant frequency between the laser cavity and the external resonant frequency is quite stable and is forgiving of perturbation resulting from tuning motions.

What is claimed is:

1. A laser system comprising:
   (a) an optically nonlinear laser gain medium;
   (b) a first reflector having a reflectivity ($R_1$) and a second reflector having a reflectivity ($R_2$) spaced from the first reflector to define a laser cavity containing the laser gain medium, such that the gain medium amplifies light reflected thereto by the first reflector;
   (c) a third reflector having a reflectivity ($R_3$) larger than $R_1$, spaced from the second reflector to define therewith a resonant cavity external to the laser cavity, such that the laser cavity mode-mismatches with the external resonant cavity, said reflectivities of the reflectors resulting in light passing from the laser cavity to resonate in the external resonant cavity and light passing from the external resonant cavity to the laser cavity and resulting in the light returned to the laser cavity from the external resonant cavity forming interference with light reflected from the second reflector back into the laser cavity; and
   (d) a light-blocker disposed between the laser gain medium and the second reflector to partially block light reflected from the second reflector to spatially selectively pass to the laser gain medium light exhibiting constructive interference at a resonance frequency of the external cavity, thereby increasing light intensity of light passed back to the laser gain medium at a resonant frequency of the external resonant cavity, to optically lock the frequency of the gain medium to the frequency of the external resonant cavity due to the nonlinearity of the laser gain medium, thereby producing more power in the external resonant cavity than in the laser cavity.

2. The system of claim 1 wherein the second reflector has a reflectivity ($R_2$) larger than the reflectivity ($R_1$) of the first reflector.

3. The system of claim 2 wherein $R_3$ is larger than $R_2$.

4. The system of claim 1 wherein the light-blocker includes an aperture.

5. The system of claim 1 wherein the light-blocker is spaced apart from the laser gain medium.

6. The system of claim 1 wherein the light-blocker includes a clear central zone, a clear annular zone concentric to the central zone, and a dark annular zone between the clear central zone and the clear annular zone.

7. The system of claim 1 wherein the reflectors each has a curvature and wherein the second reflector, the third reflector, and the light-blocker are located such that the total amount of light passed from the external resonant cavity back through the light-blocker to the laser gain medium is about a maximum at an external cavity resonant frequency.

8. The system of claim 1 wherein the light-blocker has a radial dimension such that the total amount of light passed from the external cavity back through the light-blocker to the laser gain medium is about a maximum at an external cavity resonant frequency.

9. The system of claim 1 further comprising mode-shaping optics for directing light coming from the laser gain medium to pass through the light-blocker and a second mode-shaping optics for directing light coming from the second reflector to the light-blocker.

10. The system of claim 1 wherein laser gain medium is a laser diode which is caused to lock to a resonant frequency of the external resonant cavity by the laser diode having an emission facet which is located relative to the second and the third reflectors such that the total amount of light passed from the external cavity back through the light-blocker to the laser gain medium is about a maximum at an external cavity resonant frequency.

11. The system of claim 1 wherein the laser gain medium is a laser diode which is caused to lock to a resonant frequency of the external resonant cavity by optical feedback to the laser diode more than 3% of the light transmitted from the laser diode to the external resonant cavity.

12. The system of claim 1 wherein the reflectivities of the reflectors and locations thereof are such that light intensity in the external resonant cavity is at least one order of magnitude larger than that in the laser cavity.

13. A laser system comprising:
   (a) a nonlinear laser gain medium powered for emitting a light beam;
   (b) a first reflector having a reflectivity ($R_1$) and a second reflector spaced from the first reflector to define a laser cavity containing the laser gain medium, the second reflector having a reflectivity ($R_2$) larger than the reflectivity ($R_1$) of the first reflector, such that light reflected by the first reflector to the gain medium is amplified therein;
   (c) a third reflector having a reflectivity ($R_3$) larger than the reflectivity of the first reflector ($R_1$), spaced from the second reflector to define therewith a resonant cavity external to the laser cavity, such that light passes from the laser cavity to resonate in the external resonant cavity and light passes from the external resonant cavity to the laser cavity, the laser cavity mode-mismatching with the external resonant cavity and the light returned to the laser cavity from the external resonant cavity forming interference with light reflected from the second reflector back into the laser cavity; and
   (d) an aperture disposed between the laser gain medium and the second reflector to block light reflected from the second reflector to spatially selectively pass light exhibiting constructive interference to the laser gain medium at a resonance frequency of the external cavity, thereby increasing light intensity of light passed back to the laser gain medium at a resonant frequency of the external cavity, to optically lock the frequency of the laser gain medium to the frequency of the external resonant cavity due to the nonlinearity of the laser gain medium, thereby producing more power in the external resonant cavity than in the laser cavity.

14. A laser system comprising:

(a) a laser diode, powered and having a facet for emitting light;

(b) a first reflector having a reflectivity ($R_1$) and a second reflector spaced from the first reflector to define a laser cavity containing the laser diode, the second reflector having a reflectivity ($R_2$) larger than the reflectivity ($R_1$) of the first reflector, such that light reflected by the first reflector to the laser diode is amplified therein;

(c) a third reflector having a reflectivity ($R_3$) larger than the reflectivity of the first reflector ($R_1$), spaced from the second reflector to define therewith a resonant cavity external to the laser cavity, such that light passes from the laser cavity to resonate in the external resonant cavity and light passes from the external resonant cavity to the laser cavity, the laser cavity mode-mismatching with the external resonant cavity and the light returned to the laser cavity from the external resonant cavity forming interference with light reflected from the second reflector back into the laser cavity; and (d) a light-blocker on the facet on the laser diode facing the second reflector to pass light to the second reflector and to partially block light reflected from the second reflector to spatially selectively pass light exhibiting constructive interference to the laser diode at a resonance frequency of the external cavity, thereby increasing light intensity of light passed back to the laser gain medium at a resonant frequency of the external cavity, to optically lock the frequency of the laser diode to the frequency of the external resonant cavity due to the nonlinearity of the laser diode, thereby producing more power in the external resonant cavity than in the laser cavity.

15. A method for passively locking an optically nonlinear laser gain medium, comprising:

(a) emitting a light beam from the optically nonlinear laser gain medium disposed in a laser cavity defined by a first reflector of a reflectivity ($R_1$) and a second reflector of a reflectivity ($R_2$) spaced from the first reflector and amplifying light reflected by the first reflector to the gain medium to achieve the light beam being emitted; and (b) transmitting light from the laser cavity to a resonant cavity defined by the second reflector and a third reflector of a reflectivity $R_3$ larger than $R_1$, the resonant cavity being external to the laser cavity, the positions of the reflectors being selected to mode-mismatch the laser cavity with the external resonant cavity, such that light emitted from the laser gain medium passes into and resonates in the external resonant cavity, part of the light in the external resonant cavity being transmitted back to the laser cavity due to $R_2$, such that the light passing from the second reflector to the gain medium has constructive and destructive interference portions; and (c) partially blocking light reflected from the second reflector to spatially selectively allow light portion of constructive interference to pass and block light portion of destructive interference, to optically lock the gain medium to the frequency of the external resonant cavity due to the nonlinearity of the laser gain medium, thereby producing more power in the external resonant cavity than in the laser cavity.

16. The method of claim 15, wherein the second reflector has a reflectivity ($R_2$) larger than the reflectivity ($R_1$) of the first reflector such that light resonates in the external resonant cavity to build up power therein to one or more orders of magnitude larger than the light in the laser cavity.

17. A method of making an optically locked laser system, comprising:

(a) positioning a first reflector of a reflectivity $R_1$ a distance away from a second reflector of a reflectivity $R_2$ to form a laser cavity;

(b) positioning an optically nonlinear laser gain medium and a light-blocker in the laser cavity between the laser gain medium and the second reflector such that light reflected by the first reflector to the laser gain medium is amplified for emission therefrom; and (c) forming an external resonant cavity by positioning a third reflector of a reflectivity $R_3$ larger than $R_1$ spaced from the second reflector and external to the laser cavity, such that light emitted from the laser gain medium enters and resonates in the external resonant cavity along a resonant intracavity beam path and such that the laser cavity mode-mismatchs with the external resonant cavity; wherein part of the light resonating in the external resonant cavity due to $R_2$ reenters the laser cavity from the external resonant cavity to the laser gain medium and be partially blocked by the light-blocker, while mode-mismatching the laser cavity with the external resonant cavity such that light of constructive interference at a resonant frequency is spatially selectively passed to optically lock the frequency of the gain medium to the frequency of the external resonant cavity due to the nonlinearity of the laser gain medium, thereby producing more power in the external resonant cavity than in the laser cavity.

18. The method of claim 17, further comprising selecting the size and shape and location of the light-blocker such that the total amount of light passed from the external resonant cavity back through the light-blocker to the laser gain medium is about a maximum at an external cavity resonant frequency.

19. A method for passively locking an optically nonlinear laser gain medium, comprising:

(a) emitting a light beam from the optically nonlinear laser gain medium disposed in a laser cavity defined by a first reflector of a reflectivity $R_1$ and a second reflector of a reflectivity $R_2$ and amplifying light reflected by the first reflector to the gain medium to achieve the light beam being emitted; and (b) transmitting light from the laser cavity to a resonant cavity defined by the second reflector and a third reflector of a reflectivity $R_3$ larger than $R_1$, the resonant cavity being external to the laser cavity, the positions of the reflectors being selected to mode-mismatch the laser cavity with the external resonant cavity, such that light emitted from the laser gain medium passes into and resonates in the external resonant cavity, part of the light in the external resonant cavity being transmitted back to the laser cavity due to $R_2$ such that light passing from the second reflector to the gain medium has constructive and destructive interference portions;

(c) selecting the size and shape of a light-blocker and using said light-blocker to partially block light reflected from the second reflector to spatially selectively allow the portion of constructive interference to pass and block the portion of destructive interference, thereby to optically lock the gain medium to the frequency of the external resonant cavity due to the nonlinearity of the laser gain medium thereby producing more power in the external resonant cavity than in the laser cavity.

* * * * *